United States Patent
Eikenbroek (10) Patent No.: US 7,394,418 B2
(45) Date of Patent: Jul. 1, 2008

(54) APPARATUS COMPRISING A SIGMA-DELTA MODULATOR AND METHOD OF GENERATING A QUANTIZED SIGNAL-DELTA MODULATOR

(75) Inventor: Johannes Wilhelmus Eikenbroek, Emmen (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 11/570,580

(22) PCT Filed: Jun. 23, 2005

(86) PCT No.: PCT/EP2005/006875

§ 371 (c)(1), (2), (4) Date: Jun. 8, 2007

(87) PCT Pub. No.: WO2006/002844

PCT Pub. Date: Jan. 12, 2006

(65) Prior Publication Data

US 2007/0252737 A1 Nov. 1, 2007

Related U.S. Application Data

(60) Provisional application No. 60/585,253, filed on Jul. 2, 2004.

(30) Foreign Application Priority Data

Jul. 1, 2004 (EP) .................................. 04388043

(51) Int. Cl.
*H03M 3/00* (2006.01)

(52) U.S. Cl. .................. 341/143; 341/131; 331/1 A; 331/16; 331/17; 375/376

(58) Field of Classification Search .................. 341/131
See application file for complete search history.

(56) References Cited

U.S. PATENT DOCUMENTS

| | | | | | |
|---|---|---|---|---|---|
| 5,144,308 | A | * | 9/1992 | Norsworthy | 341/131 |
| 5,903,194 | A | * | 5/1999 | Opsahl et al. | 331/1 A |
| 5,986,512 | A | * | 11/1999 | Eriksson | 331/16 |
| 6,008,703 | A | * | 12/1999 | Perrott et al. | 332/100 |
| 6,044,124 | A | * | 3/2000 | Monahan et al. | 375/376 |
| 6,175,321 | B1 | * | 1/2001 | Frannhagen et al. | 341/143 |
| 6,600,378 | B1 | * | 7/2003 | Patana | 331/1 A |
| 6,823,033 | B2 | * | 11/2004 | Fahim | 375/376 |
| 6,880,262 | B1 | * | 4/2005 | Jensen | 341/155 |
| 6,946,884 | B2 | * | 9/2005 | Holland et al. | 327/115 |
| 7,075,383 | B2 | * | 7/2006 | Adachi et al. | 332/127 |
| 2003/0174799 | A1 | * | 9/2003 | Fahim | 375/376 |
| 2004/0036636 | A1 | * | 2/2004 | Mai et al. | 341/131 |

\* cited by examiner

*Primary Examiner*—Khai M Nguyen
(74) *Attorney, Agent, or Firm*—Michael Cameron

(57) ABSTRACT

A method of generating a quantized signal in a Sigma-Delta modulator (25) comprises the steps of feeding a modulator input signal to a quantizer (15) via at least one integrator (12, 13); generating in the quantizer (15) a quantized signal; feeding back the quantized signal to be subtracted from the modulator input signal; and generating a dither signal to be applied to a point in the Sigma-Delta modulator. The dither signal is applied to a selected one of a number of different points (11, 14) in the Sigma-Delta modulator (25) in dependence of a control signal. In this way a method of generating a quantized signal in a Sigma-Delta modulator is provided which provides optimal results for different modes of the application, such as phase modulation mode and frequency modulation mode in a Bluetooth receiver.

16 Claims, 5 Drawing Sheets

PRIOR ART

APPARATUS COMPRISING A SIGMA-DELTA MODULATOR AND METHOD OF GENERATING A QUANTIZED SIGNAL-DELTA MODULATOR

This application claims the benefit of U.S. Provisional Application No. 60/585,253, filed Jul. 2, 2004, the disclosure of which is fully incorporated herein by reference.

TECHNICAL FIELD OF THE INVENTION

The invention relates to a method of generating a quantized signal in a Sigma-delta modulator arranged to operate together with a fractional divider in a frequency synthesizer for use in a receiver for modulated signals, the method comprising the steps of feeding a modulator input signal to a quantizer via at least one integrator; generating in said quantizer a quantized signal; feeding back said quantized signal to be subtracted from said modulator input signal; and generating a dither signal to be applied to a point in the Sigma-delta modulator. The invention further relates to an apparatus comprising a Sigma-delta modulator.

DESCRIPTION OF RELATED ART

Sigma-Delta modulators or converters are used in several different applications, such as phase locked loops and frequency synthesizers. In Sigma-Delta controlled synthesizers, an average division-factor constitutes an integer part and a fractional part. The fractional part is generated by a Sigma-Delta modulator which has a static input signal (the fractional part of the division-factor), while the output (the quantizer of the Sigma-Delta converter) is a multi-level signal which on its turn determines the division-factor of the synthesizer. The division-factor is "randomly" switched between several integer division-values (e.g. N−1, N and N+1) in order to arrive—on average—at the desired division-factor.

Because the input-signal of the Sigma-Delta modulator is static, so called "idle tones" may appear at the quantized output-signal. These periodic signals are unwanted and must be avoided in many applications like synthesizers for radio-equipment. U.S. Pat. No. 5,986,512 shows a phase locked loop circuit which is controlled by a Sigma-Delta modulator and in which the output oscillating signal could exhibit such unwanted tones, because the Sigma-Delta modulator is susceptible to enter into what is referred to as a "limit cycle". It should be noted that the input signal to the Sigma-Delta modulator is static, i.e. a DC level, when using the Sigma-Delta modulator in phase locked loops, because the Sigma-Delta modulator usually generates the fractional part of the division number. Every time a new channel or a new reference frequency is selected, the input signal is updated. Some properties of the Sigma-Delta modulators can be explained by linear theory, but at the output of the Sigma-Delta modulator the signal is quantized, which is a nonlinear operation. Limit cycles or "idle tones" may appear due to this nonlinear operation.

According to U.S. Pat. No. 5,986,512 a dither signal (i.e. a random signal) is applied just prior to quantization in the Sigma-Delta modulator, which reduces the likelihood that the Sigma-Delta modulator might enter a limit cycle. Thereby, the output oscillating signal generated by the phase locked loop is unlikely to contain the unwanted tones. However, it should be noted that by adding the dither signal to the quantizer-input of the Sigma-Delta modulator, these unwanted idle tones can be eliminated or reduced, but it is at the expense of some increase in noise-power at the output of the Sigma-Delta modulator. Regarding the effect of the dither signal, it is noted that when the input signal of the Sigma-Delta modulator is static, the output signal will in average equal the input signal, but there could be a repetitive behaviour in the "output oscillations" that generates idle tones. If on the other hand the input is white noise the quantization error is less correlated and the influence of idle tones is reduced. Dithering of the Sigma-Delta modulator does the same thing—decorrelate the quantization error.

The dither-signal can also be applied to other points of the Sigma-Delta modulator, such as the actual input of the modulator, which means that it is added to the static input-signal which sets the fractional-part of the overall division-factor. In U.S. Pat. No. 6,175,321 a Sigma-Delta modulator has two integrators coupled in series, and two different dither signals are added; a first dither signal is added between the two integrators while a second dither signal is added to the input of the quantizer. In EP 709 969 the dither signal may be added at any point in the Sigma-Delta modulator, included its input, provided suitable filtering of the dither signal.

Usually the dither signal is applied to the input of the quantizer, because the closed-loop signal-transfer of the dither signal to the output of the modulator, i.e. the output of the quantizer, has a high-pass transfer. This is beneficial because the white noise of the dither signal is shaped to a high-pass spectral shape, but the wanted signal spectrum usually is low-pass, resulting in a frequency separation between the wanted signal and the shaped noise. The high frequency part of the shaped noise will be suppressed by the low-pass closed loop transfer of the synthesizer once the converter is used in a synthesizer.

In many applications it turns out that the Sigma-Delta induced phase noise is still the dominant phase noise contributor for frequencies outside the closed-loop bandwidth of the synthesizer. By increasing the order of the loop and/or decreasing the loop bandwidth this noise can be reduced, but due to stability reasons it is not easy to increase the order of the loop, while decreasing the loop bandwidth will increase the settling-time for a frequency-step which is not desired in many applications. In addition, the trend is to integrate the passive loop-filter components as well and this will be easier to realise when the order of the loop is as low as possible.

One example of the use of a Sigma-Delta modulator is frequency synthesizers for use in Bluetooth-receivers. For Bluetooth frequency-modulation is used as the modulation format. The wanted signal can be obtained from the transmitted signal by a frequency demodulator which converts the wanted-signal to a signal whose amplitude is proportional to the derivative of the momentary phase of this wanted-signal. Due to this differentiation, noise-components with a higher frequency than others will be enhanced in level compared to noise with a lower frequency. This will influence the "ripple" of the demodulated wanted-signal in practice. This happens to the Bluetooth-signal due to the Sigma-Delta modulator induced phase-noise of the synthesizer. (This phase noise was added to the wanted-signal in the transmitter during upconversion to the desired RF-frequency). In practice it turns out that this mechanism adversely influences the Bluetooth "Modulation Characteristics" performance, e.g. the test-result during the alternating bit-sequence test.

In order to minimise the degradation due to the induced phase-noise, the dither-signal may be applied to the input of the Sigma-Delta converter instead of the quantizer-input. Note that in this case the level of the in-band phase noise of the synthesizer output-signal will increase. However due to the differentiation-action in a frequency-demodulator, the low-frequency part of the noise will be less harmful. Thus for normal Bluetooth applications it is preferred to apply the dither signal to the input of the Sigma-Delta modulator.

However, in the near future the extensions to Bluetooth, medium-rate and high-rate, will use phase-modulation instead of frequency-modulation as the modulation-format. It can be shown that a phase-demodulator is more sensitive to the level of the in-band phase noise of the low-pass shaped synthesizer phase noise. Especially coherent phase demodulators will exhibit this phenomenon. For this modulation-format (i.e. phase-modulation) it is beneficial to add the dither-signal to the guantizer-input of the converter in order to exhibit a high-pass transfer of the dither-noise.

A Bluetooth-connection will typically start in the basic Bluetooth-mode with frequency-modulation and then switch to phase-modulation once the higher data-rate is initiated. If a Sigma-Delta modulator in which the dither signal is added to its input is used, the receiver in frequency modulation mode does not work optimally, and if, on the other hand, a Sigma-Delta modulator in which the dither signal is added to the quantizer input is used, the phase modulation mode will not be optimal, because the Sigma-Delta modulator has to be designed to one of the modes with the result that the performance in the other mode is not satisfactory. Similar problems also exist for other applications having different modes and using Sigma-Delta modulators. US 2003/174799 shows a frequency synthesizer including a voltage controlled oscillator and a Sigma-Delta controlled phase-locked loop that determines the output frequency synthesizer. To avoid repetitive cycles in the Sigma-Delta controlled phase-locked loop, a dither signal is introduced to the Sigma-Delta modulator. The Sigma-Delta modulator includes a first order M-N accumulator and a second order M-N accumulator, and two AND gates allow enabling signals to connect the dither signal to the first order and/or the second order M-N accumulator.

Sudhakar Pamarti et al., "A Wideband 2.4-GHz Delta-Sigma Fractional-N PLL With 1-Mb/s In-Loop Modulation", IEEE JOURNAL OF SOLID-STATE CIRCUITS, vol. 39, no. 1, Jan. 2004, pages 49-62 shows a fractional-N phase locked loop implemented with a Delta-Sigma modulator for use in a Bluetooth receiver. A dither signal may be applied to the input of the Delta-Sigma modulator to eliminate spurious tones.

Therefore, it is an object of the invention to provide a method of generating a quantized signal in a Sigma-delta modulator which provides optimal results for different modes of the application, such as phase modulation mode and frequency modulation mode in a Bluetooth receiver.

SUMMARY

According to the invention the object is achieved in that the method further comprises the step of applying said dither signal to a selected one of a number of different points in the Sigma-delta modulator in dependence of a control signal indicating a modulation format for said modulated signals.

When the injection of the dither signal can be switched between selected points in the Sigma-Delta modulator under control of a control signal the performance of the Sigma-Delta modulator can easily be adapted to the different modes of the application.

Expediently, one of the number of different points in the Sigma-delta modulator may be an input to the quantizer. Similarly, another one of the number of different points in the Sigma-delta modulator may be a terminal for the modulator input signal. This allows the application of the dither signal to be switched between the two positions mentioned above.

In an expedient embodiment, the dither signal is applied to a first point in the Sigma-Delta modulator when the modulated signals are modulated according to a first modulation format and applied to a second point in the Sigma-Delta modulator when the modulated signals are modulated according to a second modulation format.

The frequency synthesizer may be used in a receiver for Bluetooth signals. In that case the dither signal may be applied to a first point in the Sigma-Delta modulator when the Bluetooth signals are frequency modulated and applied to a second point in the Sigma-Delta modulator when the Bluetooth signals are phase modulated.

The method may further comprise the step of applying an additional dither signal to at least one other point in the Sigma-Delta modulator. This allows dither to be applied to some points permanently and to other points in dependence of the control signal.

As mentioned, the invention also relates to an apparatus comprising a Sigma-delta modulator arranged to operate with a fractional divider in a frequency synthesizer adapted for use in a receiver for modulated signals, said Sigma-delta modulator comprising at least one integrator having an input connected to a modulator input signal; a quantizer arranged to generate a quantized signal and having an input connected to an output of said integrator; means for feeding back said quantized signal to be subtracted from said modulator input signal; and a dither signal generator arranged to generate a dither signal to be applied to a point in the Sigma-delta modulator. When the Sigma-delta modulator further comprises means for applying said dither signal to a selected one of a number of different points in the Sigma-delta modulator in dependence of a control signal indicative of a modulation format for said modulated signals, a quantized signal can be generated in a Sigma-delta modulator which provides optimal results for different modes of the application, such as phase modulation mode and frequency modulation mode in a Bluetooth receiver.

Expediently, one of the number of different points in the Sigma-delta modulator may be an input to the quantizer. Similarly, another one of the number of different points in the Sigma-delta modulator may be a terminal for said modulator input signal. This allows the application of the dither signal to be switched between the two positions mentioned above.

In an expedient embodiment, the means for applying the dither signal is arranged to apply the dither signal to a first point in the Sigma-Delta modulator when said modulated signals are modulated according to a first modulation format and to apply the dither signal to a second point in the Sigma-Delta modulator when said modulated signals are modulated according to a second modulation format.

The frequency synthesizer may be adapted for use in a receiver for Bluetooth signals. In that case the means for applying the dither signal may be arranged to apply the dither signal to a first point in the Sigma-Delta modulator when said Bluetooth signals are frequency modulated and to apply the dither signal to a second point in the Sigma-Delta modulator when said Bluetooth signals are phase modulated.

The apparatus may further be arranged to apply an additional dither signal to at least one other point in the Sigma-Delta modulator. This allows dither to be applied to some points permanently and to other points in dependence of the control signal.

BRIEF DESCRIPTION OF THE DRAWINGS

The invention will now be described more fully below with reference to the drawings, in which.

DETAILED DESCRIPTION OF EMBODIMENTS

Figure 1:
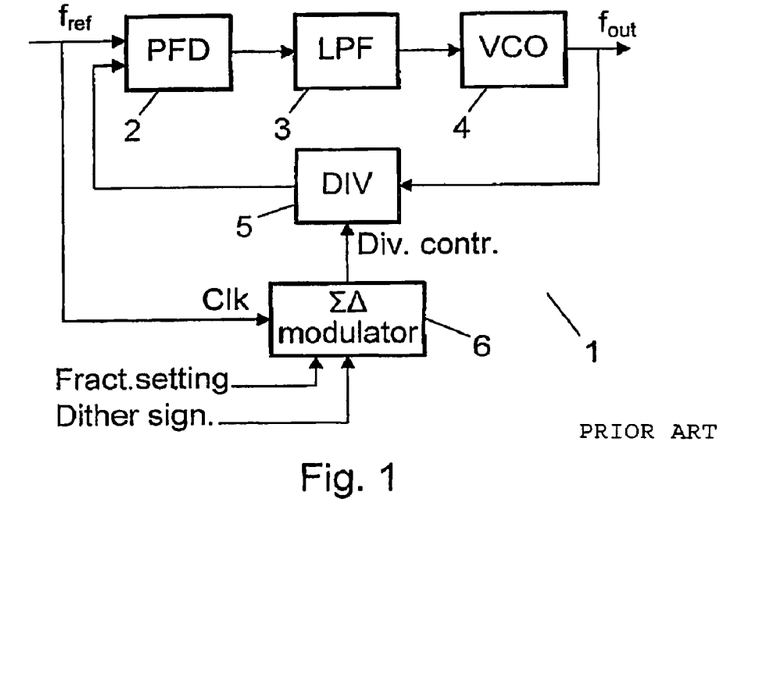
FIG. 1 shows a block diagram of a Sigma-Delta controlled synthesizer in which the invention can be used.

A diagram of a Sigma-Delta controlled frequency synthesizer 1, in which the invention can be used, is shown in FIG. 1. The synthesizer 1 includes a phase locked loop circuit. Such synthesizers may be used in several applications, e.g. transceiver systems or stand-alone receivers, which may contain or use Bluetooth demodulators.

A reference signal $f_{ref}$, to which the phase locked loop circuit is to be regulated, is fed to a phase and/or frequency detector (PFD) 2. This signal is usually a signal having high frequency stability. The output of the phase/frequency detector 2 is fed through a filter 3, which is typically a low pass filter (LPF), to a voltage controlled oscillator (VCO) 4 generating the output signal $f_{out}$. The signal $f_{out}$ is further fed back to a frequency divider (DIV) 5, and a frequency divided signal generated by the divider 5 is then applied to another input of the phase and/or frequency detector 2, so that a feedback loop is provided. Thus the phase/frequency relationship between the frequency divided signal generated by the divider 5 and the reference signal $f_{ref}$ is compared, and the output of the phase/frequency detector 2 is representative of the phase/frequency difference between these two signals. The voltage controlled oscillator 4 is thus provided with a filtered voltage signal representative of this phase/frequency difference, and $f_{out}$ is regulated according thereto.

In the frequency divider 5 the $f_{out}$ frequency is divided by a division factor before it is compared with the reference signal in the phase and/or frequency detector 2. To improve resolution, fractional synthesis may be utilized. The division factor may also be regulated, and the average division factor thus constitutes an integer part and a fractional part. As shown in FIG. 1, the fractional part may be controlled by a division control signal generated by a Sigma-Delta modulator 6. The Sigma-Delta modulator 6 receives a static fraction setting input signal and provides a multi-level signal, which on its turn determines the division factor of the synthesizer. The division factor is randomly switched between several integer division values (e.g. N−1, N and N+1) in order to arrive—on average—at the desired division-factor.

Because the input-signal of the Sigma-Delta modulator is static, so called "idle tones" may appear at the modulator output signal and the output oscillating signal $f_{out}$. These periodic signals are unwanted and must be avoided in many applications like synthesizers for radio-equipment. This can be achieved by adding a dither signal to the Sigma-Delta modulator, as also shown in FIG. 1. Thereby, the output oscillating signal generated by the phase locked loop is unlikely to contain the unwanted tones. However, it should be noted that by adding the dither signal to the Sigma-Delta modulator, these unwanted idle tones can be eliminated or reduced, but it is at the expense of some increase in noise power at the output of the Sigma-Delta modulator.

Figure 2:
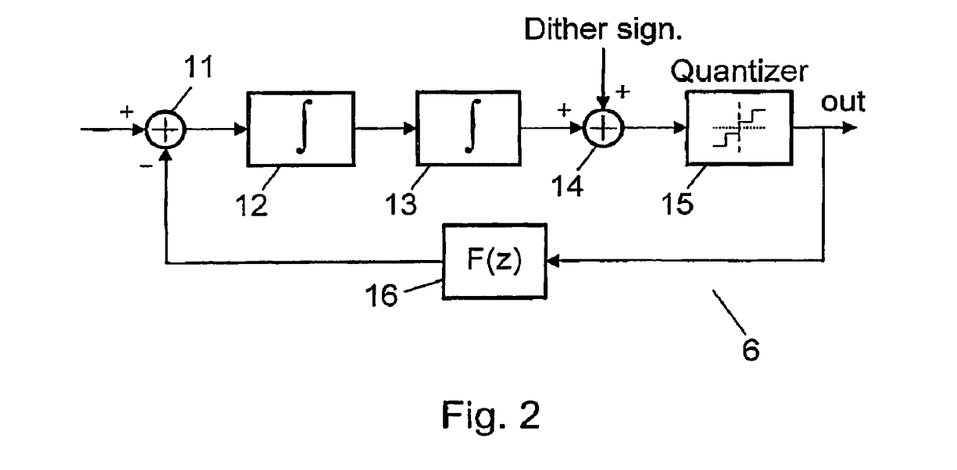
FIG. 2 shows a Sigma-Delta modulator with a dither signal coupled to the quantizer input.

FIG. 2 shows an example of a Sigma-Delta modulator 6. The input signal of the Sigma-Delta modulator 6 is fed to a quantizer 15 via two integrators 12, 13, and the quantized output signal is fed back through a filter 16 to subtract from the input signal in the summation point 11. This feedback forces the average value of the quantized signal to track the average input signal. A difference between these signals accumulates in the integrators 12, 13 and eventually corrects itself. Instead of the two integrators 12, 13, a single integrator may also be used. The response of the Sigma-Delta modulator to e.g. a ramp input is so that the quantized output signal oscillates between two levels that are adjacent to the input in such a manner that its local average equals the average input value. In the summation point 14 the dither signal is added to the quantizer input.

When the dither signal is applied to the input of the quantizer, the closed-loop signal-transfer of the dither signal to the output of the Sigma-Delta modulator, i.e. the output of the quantizer 15, has a high-pass transfer. This is beneficial, especially for synthesizers used in receivers of phase modulated signals, because the white noise of the dither signal is shaped to a high-pass spectral shape, but the wanted signal spectrum usually is low-pass, resulting in a frequency separation between the wanted signal and the shaped noise. The high frequency part of the shaped noise will be suppressed by the low-pass closed loop transfer of the synthesizer once the converter is used in a synthesizer. It can be shown that a phase receiver is more sensitive to the level of the in-band phase noise of the low-pass shaped synthesizer phase noise. Especially coherent phase receivers will exhibit this phenomenon.

However, in many applications it turns out that the Sigma-Delta induced phase noise is still the dominant phase noise contributor for frequencies outside the closed-loop bandwidth of the synthesizer. By increasing the order of the loop and/or decreasing the loop bandwidth this noise can be reduced, but due to stability reasons it is not easy to increase the order of the loop, while decreasing the loop bandwidth will increase the settling-time for a frequency-step which is not desired in many applications. In addition, the trend is to integrate the passive loop-filter components as well and this will be easier to realise when the order of the loop is as low as possible.

When frequency-modulation is used as the modulation format, the wanted signal can be obtained from the transmitted signal by a frequency demodulator which converts the wanted-signal to a signal whose amplitude is proportional to the derivative of the momentary phase of this wanted-signal. Due to this differentiation, noise-components with a higher frequency than others will be enhanced in level compared to noise with a lower frequency. This will influence the "ripple" of the demodulated wanted-signal in practice for e.g. a Bluetooth-signal due to the Sigma-Delta modulator induced phase-noise of the synthesizer. (This phase noise was added to the wanted-signal in the transmitter during up conversion to the desired RF-frequency). In practice it turns out that this mechanism adversely influences the Bluetooth "Modulation Characteristics" performance, e.g. the test-result during the alternating bit-sequence test.

Figure 3:
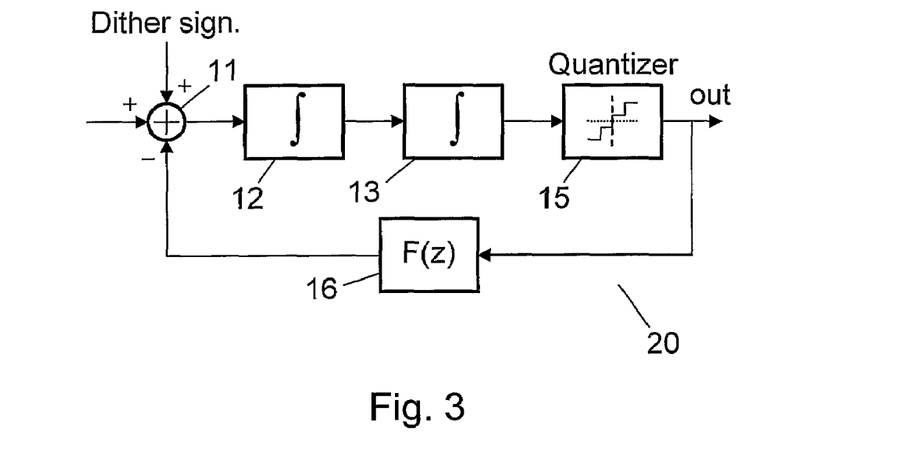
FIG. 3 shows a Sigma-Delta modulator with a dither signal coupled to the input of the modulator.

This degradation due to the induced phase-noise may be minimized when the dither-signal is applied to the input of the Sigma-Delta modulator instead of the quantizer-input. This is illustrated in FIG. 3, where the dither signal is added to the loop of the Sigma-Delta modulator 20 in the summation point 11. In this case the level of the in-band phase noise of the synthesizer output-signal will increase. However due to the differentiation-action in a frequency-demodulator, the low-frequency part of the noise will be less harmful. Thus for frequency modulation applications it is preferred to apply the dither signal to the input of the Sigma-Delta converter. Measurements show that the performance with respect to the Bluetooth "Modulation Characteristics" is improved when the dither signal is fed to the signal input of the Sigma-Delta modulator compared to the quantizer input.

On the other hand, simulations of a phase modulated system shows that a high pass spectral shape of the phase noise, which is obtained by adding the dither signal to the quantizer input, gives a better Error Vector Magnitude (EVM) performance than low pass spectral shaped phase noise, especially when a coherent demodulator is used for the EVM measurement.

Standard Bluetooth uses frequency modulation, and in Sigma-Delta modulators used in synthesizers for demodulation of standard Bluetooth signals it is therefore preferred to apply the dither signal at the input of the Sigma-Delta modulator. However, in the near future the extensions to Bluetooth, medium-rate and high-rate, will use phase modulation instead of frequency modulation as the modulation format, and here it is, as mentioned above, preferred to apply the dither signal at the quantizer input.

A Bluetooth-connection will typically start in the basic Bluetooth-mode with frequency-modulation and then switch to phase-modulation once the higher data-rate is initiated. If a Sigma-Delta modulator in which the dither signal is added to its input is used, the receiver in frequency modulation mode does not work optimally, and if, on the other hand, a Sigma-Delta modulator in which the dither signal is added to the quantizer input is used, the phase modulation mode will not be optimal, because the Sigma-Delta modulator has to be designed to one of the modes with the result that the performance in the other mode is not satisfactory. Similar problems also exist for other applications having different modes and using Sigma-Delta modulators.

Figure 4:
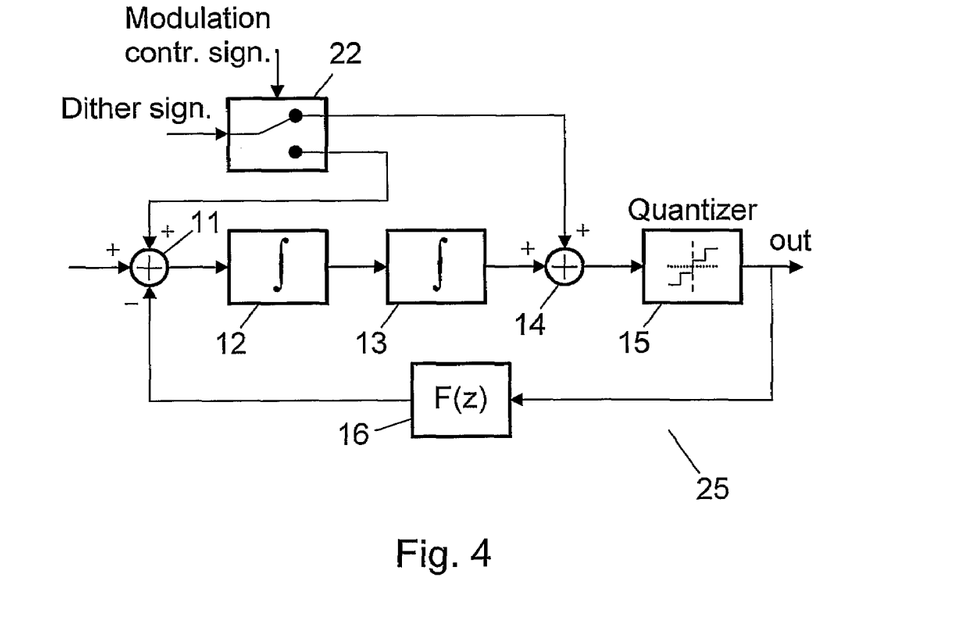
FIG. 4 shows an improved Sigma-Delta modulator in which the dither signal can be switched between the quantizer input and the input of the modulator.

FIG. 4 shows an improved Sigma-Delta modulator 25, which as an example can be used in a Bluetooth receiver designed to handle both modulation formats. In addition to the components of the Sigma-Delta modulator 6 of FIG. 2 the improved Sigma-Delta modulator 25 has a switching element 22 to which the dither signal is connected. Under control of a modulation control signal the dither signal can be switched between the two possible input positions described above, depending on which modulation format is used, and the phase noise introduced by the Sigma-Delta modulator can be optimally suppressed for both modulation formats. This can simply be implemented in the digital domain, because typically the complete Sigma Delta modulator is implemented in the digital domain. The baseband signal that initiates the conversion between modulation formats can be used as the control signal that applies the dither signal to either the input of the Sigma-Delta modulator or the quantizer input.

When the modulation-format dependent dither control is applied, the phase noise contribution of the Sigma-Delta modulator to the demodulated signal will be minimised for both modulation formats. This will increase the likelihood that the test specification of the transmitter signal will be met more easily in practice. The standard Bluetooth test that is mostly affected is the "Modulation Characteristics" of the transmitted signal, while the test that is mostly affected for medium rate and high rate will be the EVM-test of the transmitted signal. In addition, the received signal will also be less affected by phase noise induced by the Sigma-Delta modulator, so the BER-floor (Bit Error Rate) might improve.

Figure 5:
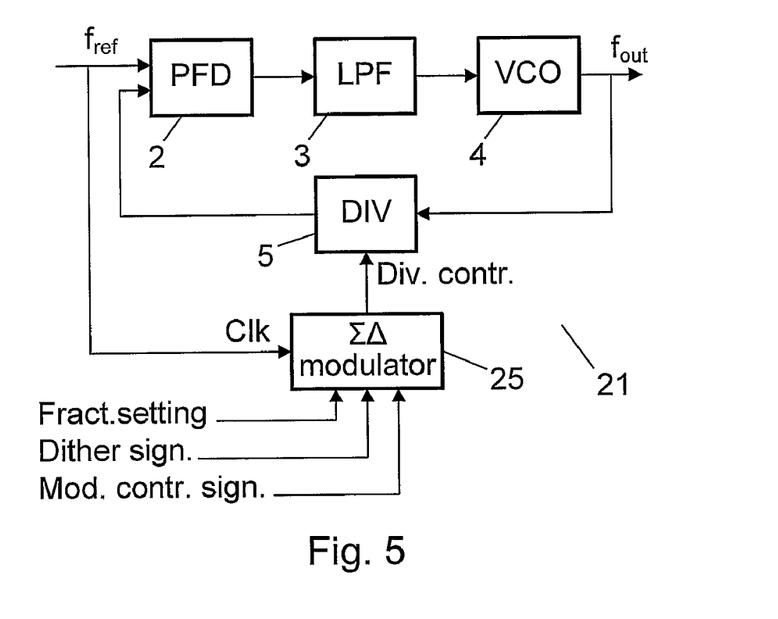
FIG. 5 shows a block diagram of a Sigma-Delta controlled synthesizer with the improved Sigma-Delta modulator of FIG. 4.

FIG. 5 shows the use of the improved Sigma-Delta modulator 25 in a synthesizer 21. Except for the use of the improved Sigma-Delta modulator 25 and the additional modulation control signal the synthesizer 21 is similar to the synthesizer 1 in FIG. 1.

In FIG. 4 the switching element 22 applies the same dither signal to either the summation point 11 or the summation point 14. However, as shown in the Sigma-Delta modulator 26 in FIG. 6, the dither signal may also be added to the respective summation points through different filters 27, 28, so that the resulting dither signal added to one of the summation points is specifically adapted to be added at this summation point. Alternatively, as shown in the Sigma-Delta modulator 30 in FIG. 7, two separate and different dither signals generated in two separate dither generators 31, 32 may be used. The two dither signals are coupled to the summation points 11 and 14 by means of the double switching element 33, which is controlled by a control signal. The type of the control signal may depend on the application. It could be the modulation control signal mentioned above, but in other applications other signals may be used.

The dither signal or dither signals may also be added at more than two different points in the Sigma-Delta modulator, and some may be added dependent of the control signal while others may be added permanently. An example is shown in the Sigma-Delta modulator 36 in FIG. 8. Here the dither signal may be applied selectively, as in FIG. 6, to one of the summation points 11 and 14 under control of the switching element 22, but in addition the dither signal is permanently added to the summation point 38 between the two integrators 12 and 13. Naturally, it could just as well be one of the other summation points to which the dither signal is added permanently, or it could be added permanently to two of them, while it is added to a third one in dependence of the control signal. Again separate dither signal generators could also be used, as shown in the Sigma-Delta modulator 40 in FIG. 9, where a dither signal from the dither signal generator 41 is added permanently to summation point 42, while one of the signals from the dither signal generators 31 and 32 is added to one of the summation points 11 and 14 in dependence of the control signal. Also here the dither signals and the summation points may be combined in other ways.

Figure 6:
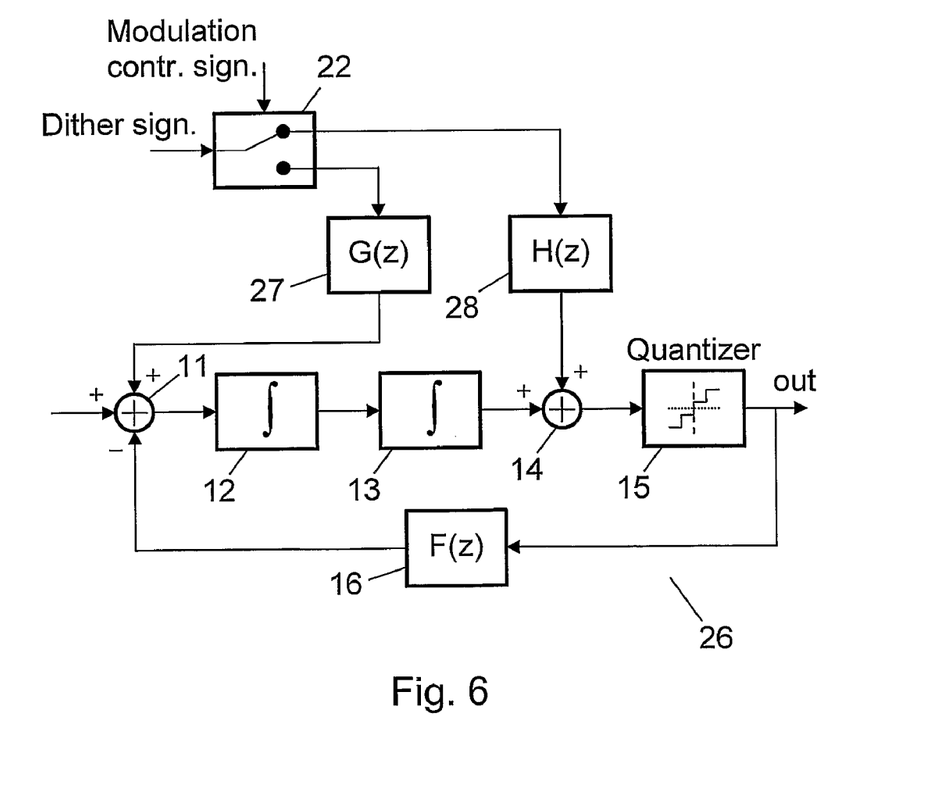
FIG. 6 shows a Sigma-Delta modulator in which the dither signal is coupled to the two points through different filters.
Figure 7:
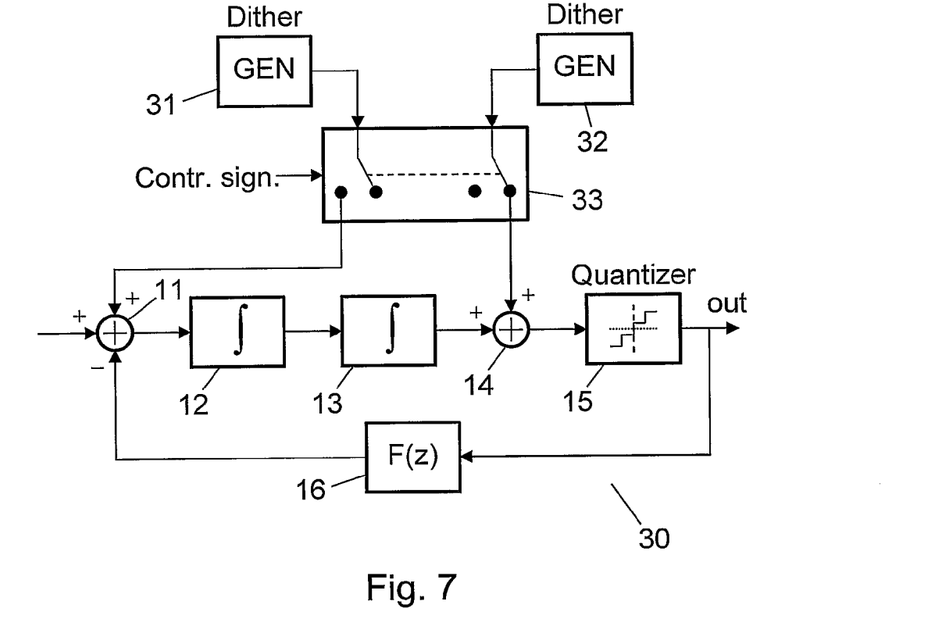
FIG. 7 shows a Sigma-Delta modulator in which two different dither signals can be coupled to the two points.
Figure 8:
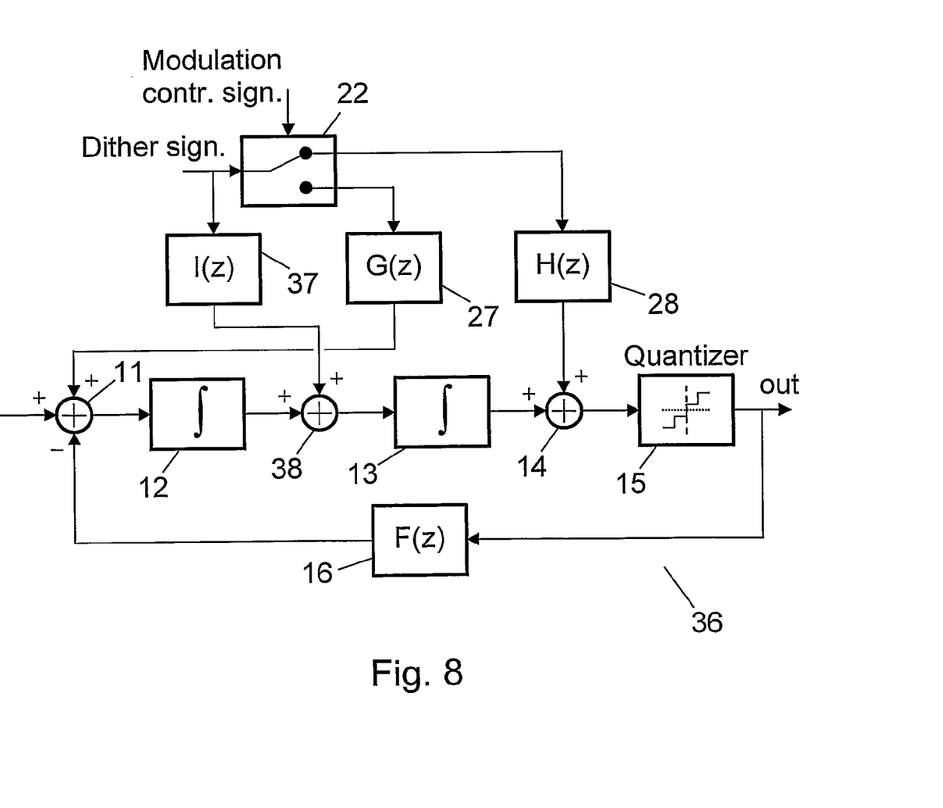
FIG. 8 shows the Sigma-Delta modulator of FIG. 6 with an additional dither signal coupled to a further point in the modulator.
Figure 9:
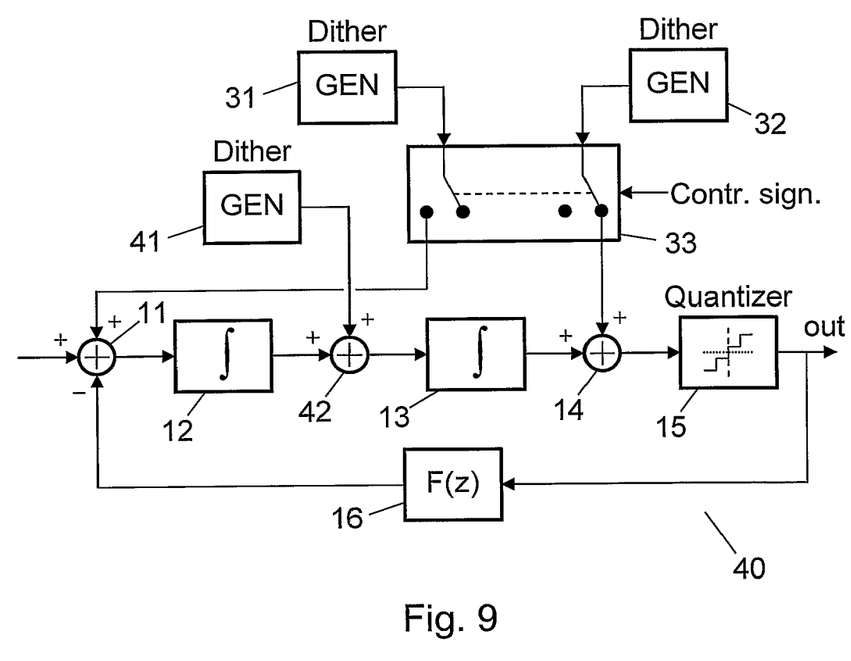
FIG. 9 shows the Sigma-Delta modulator of FIG. 7 with an additional dither signal coupled to a further point in the modulator.

In the embodiments shown in FIGS. 6 and 8 the dither signals are added to the respective summation points through filters. However, it should be noted that in all the embodiments shown in FIGS. 4 and 6 to 9 each dither signal may be filtered or not, or the dither generator itself may include a filter. The dither signals may be filtered in the dither generator, outside the dither generator or not at all. One signal may be filtered, one may not be filtered, etc. In this respect, all combinations are possible.

The Sigma-Delta modulators described above may be implemented either in the analog domain or the digital domain.

Although a preferred embodiment of the present invention has been described and shown, the invention is not restricted to it, but may also be embodied in other ways within the scope of the subject-matter defined in the following claims.

The invention claimed is:

1. A method of generating a quantized signal in a Sigma-Delta modulator arranged to operate together with a fractional divider in a frequency synthesizer for use in a receiver for modulated signals, the method comprising the steps of: feeding a modulator input signal to a quantizer via at least one integrator; generating in said quantizer a quantized signal; feeding back said quantized signal to be subtracted from said modulator input signal; generating a dither signal to be applied to a point in the Sigma-Delta modulator; and applying said dither signal to a selected one of a number of different points in the Sigma-Delta modulator in dependence of a control signal indicating a modulation format said modulated signals.

2. The method according to claim 1, wherein one of said number of different points in the Sigma-Delta modulator is an input to said quantizer.

3. The method according to claim 1, wherein one of said number of different points in the Sigma-Delta modulator is a terminal for said modulator input signal.

4. A method according to claim 3, wherein the dither signal is applied to a first point in the Sigma-Delta modulator when said modulated signals are modulated according to a first modulation format and applied to a second point in the Sigma-Delta modulator when said modulated signals are modulated according to a second modulation format.

5. The method according to claim 2, wherein the dither signal is applied to a first point in the Sigma-Delta modulator when said modulated signals are modulated according to a first modulation format and applied to a second point in the Sigma-Delta modulator when said modulated signals are modulated according to a second modulation format.

6. The method according to claim 1, wherein the dither signal is applied to a first point in the Sigma-Delta modulator when said modulated signals are modulated according to a first modulation format and applied to a second point in the Sigma-Delta modulator when said modulated signals are modulated according to a second modulation format.

7. The method according to claim 1 wherein the frequency synthesizer is used in a receiver for Bluetooth signals.

8. The method according to claim 7, wherein the dither signal is applied to a first point in the Sigma-Delta modulator when said Bluetooth signals are frequency modulated and applied to a second point in the Sigma-Delta modulator when said Bluetooth signals are phase modulated.

9. The method according to claim 1 wherein the method further comprises the step of applying an additional dither signal to at least one other point in the Sigma-Delta modulator.

10. An apparatus comprising a receiver for modulated signals, said receiver comprising a frequency synthesizer in which a Sigma-Delta modulator is arranged to operate together with a fractional divider, said Sigma-Delta modulator comprising: at least one integrator having an input connected to a modulator input signal; a quantizer arranged to generate a quantized signal and having an input connected to an output of said integrator; means for feeding back said quantized signal to be subtracted from said modulator input signal; a dither signal generator arranged to generate a dither signal to be applied to a point in the Sigma-Delta modulator; and means for applying said dither signal to a selected one of a number of different points in the Sigma-Delta modulator in dependence of a control signal indicative of a modulation format for said modulated signals.

11. The apparatus according to claim 10, wherein one of said number of different points in the Sigma-Delta modulator is an input to said quantizer.

12. The apparatus according to claim 10, wherein one of said number of different points in the Sigma-Delta modulator is a terminal for said modulator input signal.

13. The apparatus according to claim 10, wherein the means for applying the dither signal is arranged to apply the dither signal to a first point in the Sigma-Delta modulator when said modulated signals are modulated according to a first modulation format and to apply the dither signal to a second point in the Sigma-Delta modulator when said modulated signals are modulated according to a second modulation format.

14. The apparatus according to claim 10 wherein the frequency synthesizer is adapted for use in a receiver for Bluetooth signals.

15. The apparatus according to claim 14, wherein the means for applying the dither signal is arranged to apply the dither signal to a first point in the Sigma-Delta modulator when said Bluetooth signals are frequency modulated and to apply the dither signal to a second point in the Sigma-Delta modulator when the Bluetooth signals are phase modulated.

16. The apparatus according to claim 10, wherein the apparatus is further arranged to apply an additional dither signal to at least one other point in the Sigma-Delta modulator.

* * * * *